(12) United States Patent
Asuri et al.

(10) Patent No.: US 7,142,574 B2
(45) Date of Patent: Nov. 28, 2006

(54) LASER DRIVER CIRCUIT AND SYSTEM

(75) Inventors: Bhushan S. Asuri, Oak Park, CA (US); Ty Yoon, Calabasas, CA (US)

(73) Assignee: Intel Corporation, Santa Clara, CA (US)

( * ) Notice: Subject to any disclaimer, the term of this patent is extended or adjusted under 35 U.S.C. 154(b) by 287 days.

(21) Appl. No.: 10/442,829

(22) Filed: May 21, 2003

(65) Prior Publication Data

US 2004/0233947 A1 Nov. 25, 2004

(51) Int. Cl.
*H01S 3/00* (2006.01)
(52) U.S. Cl. .................................. 372/38.02; 372/38.1
(58) Field of Classification Search ..... 372/38.1–38.07
See application file for complete search history.

(56) References Cited

U.S. PATENT DOCUMENTS

| | | | | |
|---|---|---|---|---|
| 4,789,987 | A * | 12/1988 | Fraser | 372/31 |
| 5,224,112 | A * | 6/1993 | Uesaka | 372/38.02 |
| 5,268,916 | A * | 12/1993 | Slawson et al. | 372/29.021 |
| 5,268,917 | A | 12/1993 | Davies | |
| 5,402,433 | A * | 3/1995 | Stiscia | 372/31 |
| 5,502,298 | A | 3/1996 | Geller | |
| 5,535,038 | A * | 7/1996 | Hinch | 398/182 |
| 5,754,576 | A | 5/1998 | Kusano et al. | |
| 5,802,089 | A | 9/1998 | Link | |
| 5,850,409 | A | 12/1998 | Link | |
| 5,883,910 | A | 3/1999 | Link | |
| 5,978,393 | A | 11/1999 | Feldman | |
| 6,055,252 | A | 4/2000 | Zhang | |
| 6,356,374 | B1 | 3/2002 | Farhan | |
| 6,408,013 | B1 | 6/2002 | Akagi et al. | |
| 6,414,974 | B1 * | 7/2002 | Russell et al. | 372/38.02 |
| 6,490,302 | B1 * | 12/2002 | Koishi et al. | 372/38.02 |
| 6,494,370 | B1 | 12/2002 | Sanchez | |
| 6,549,310 | B1 | 4/2003 | Kuchta | |
| 6,587,530 | B1 | 7/2003 | Hutchison | |
| 6,629,638 | B1 | 10/2003 | Sanchez | |
| 6,654,565 | B1 * | 11/2003 | Kenny | 398/182 |
| 6,744,795 | B1 * | 6/2004 | Magoon | 372/38.02 |
| 6,822,987 | B1 * | 11/2004 | Diaz et al. | 372/38.02 |
| 2002/0172240 | A1 | 11/2002 | Kwark | |
| 2003/0007525 | A1 | 1/2003 | Chen | |
| 2003/0025971 | A1 | 2/2003 | Price et al. | |
| 2003/0067947 | A1 | 4/2003 | Zhang et al. | |
| 2004/0008745 | A1 | 1/2004 | Magoon | |

FOREIGN PATENT DOCUMENTS

EP 0662740 A2 7/1995

(Continued)

OTHER PUBLICATIONS

2002 IEEE, Standard Draft, Reconciliation Sublayer (RS) and 10 Gigabit Media Independent Interface (XGMII), May 1, 2002, 37 pages.
Data Sheet for Summit Microelectronics, Inc. part SML 2108 (Dual Laser Diode Adaptive Power Controller with Look Up Table), Oct. 3, 2001, 21 pages.

(Continued)

*Primary Examiner*—James Menefee
*Assistant Examiner*—Phillip Nguyen
(74) *Attorney, Agent, or Firm*—Grossman, Tucker, Perreault & Pfleger, PLLC (57) ABSTRACT

Described is a laser driver circuit to generate a bias current based, at least in part, upon a reference average power signal and a measured average power signal, and to generate a modulation current based, at least in part, upon a reference swing power and a measured swing power signal.

24 Claims, 6 Drawing Sheets

FOREIGN PATENT DOCUMENTS

WO        WO-04106997 A2    12/2004

OTHER PUBLICATIONS

Data Sheet for Maxim Integrated Products part MAX 3865 (2.5 Gbps Laser Drive Automatic Modulation Control), 4/2, 16 pages.
Data Sheet for Evaluation Kit for Maxim Integrated Products part MAX 3865, 2/2, 14 pages.
International Search Report Dated Mar. 18, 2004, PCT/US2004/014601, 7 Pages.
Written Opinion Of the International Searching Authority Dated Mar. 18, 2005, PCT/US2004/014601, 5 Pages.
English Translation of Official Letter, Dated Jan. 20, 2005, in Corresponding Taiwan Application No. 93113834, 1 Page.
English Translation of Offical Letter, Dated Aug. 15, 2005 in Corresponding Taiwan Application Number 93113834, 2 Pages.
International Preliminary Report on Patentability: Dated Dec. 8, 2005: PCT/US2004/014601, 7 pgs.
Copy of Office Action mailed Mar. 29, 2006 for P15741TW, Application No. 93113834 which was filed May 17, 2004, 4 pgs.
"PCT International Search Report dated Apr. 23, 2004, related International Application No. PCT/US 03/36309, International Filing Date Nov. 12, 2003",.

* cited by examiner

LASER DRIVER CIRCUIT AND SYSTEM

RELATED U.S. PATENT APPLICATIONS

The subject matter disclosed herein relates to U.S. patent application Ser. No. 10/321,177, filed on Dec. 16, 2002.

BACKGROUND

1. Field:

The subject matter disclosed herein relates to data communication systems. In particular, the subject matter disclosed herein relates to transmitting data in an optical transmission medium.

2. Information:

Data transmission in an optical transmission medium such as fiber optic cabling has enabled communication at data rates of 10 gigabits per second and beyond according to data transmission standards set forth in IEEE Std. 802.3ae-2002, Synchronous Optical Network/Synchronous Digital Hierarchy (SONET) protocol as indicated in a set of standards provided by the American National Standards Institute (ANSI T1.105.xx) or Synchronous Digital Hierarchy (SDH) as indicated in a set of recommendations provided by the International Telecommunications Union (e.g., ITU-T G.707, G.708, G.709, G.783 and G.784). To transmit data in the optical transmission medium, a laser device typically modulates an optical signal in response to a data signal.

Figure 1:
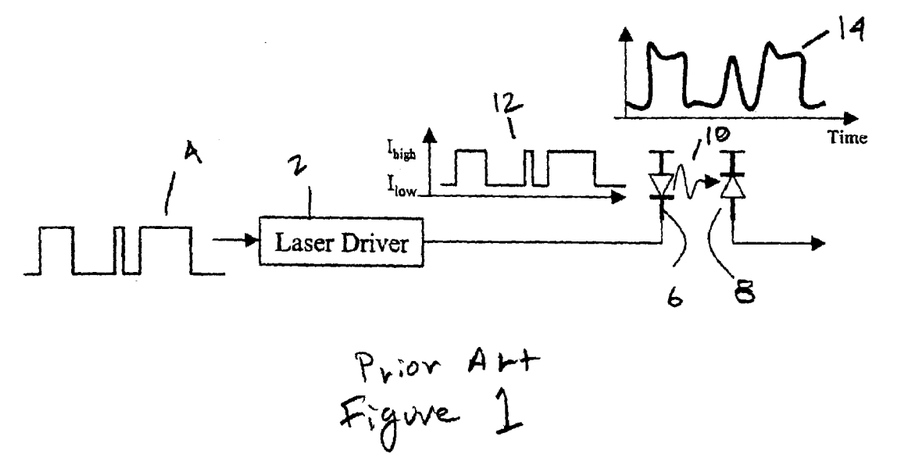
FIG. 1 shows a schematic diagram of a prior art laser driver circuit to provide power to a laser device.

FIG. 1 shows a schematic diagram of a prior art laser driver circuit 2 to provide power to a laser diode 6. In response to the pulse data signal 4, the laser driver circuit 2 provides a pulse current signal 12 and a nominally fixed bias current (not shown) to the laser diode 6. In response to the pulse current signal 12, the laser diode 6 transmits a light signal 10 having an output power 14. A photodiode 8 measures the output power 14 to be used in evaluating the performance of the laser driver circuit 2 or the laser diode 6.

Figure 2:
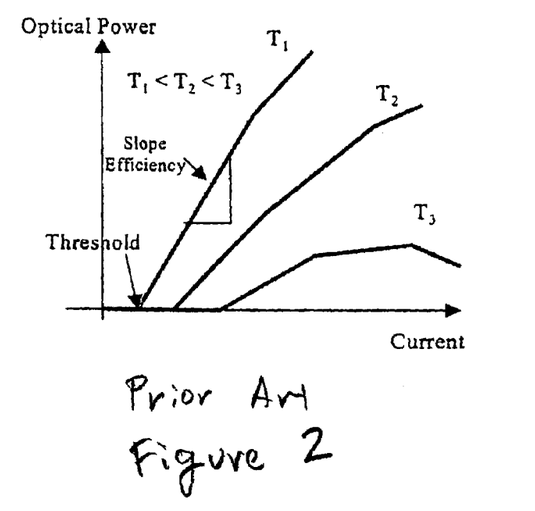
FIG. 2 shows a graph illustrating typical effects of temperature on a slope efficiency and threshold associated with a laser device.

A slope efficiency typically expresses an efficiency of a laser device in generating an output power in response to an input current signal. For example, a slope efficiency is typically expressed as a measurement of a change in output power of a light signal from a laser device divided by a magnitude of a change in input current signal provided to the laser device to transmit the light signal when the laser device is properly biased. The slope efficiency associated with a particular laser device typically changes as a function of age or operating temperature. Beyond a threshold bias current (generated by a laser driver as a component to a pulse current signal), any additional bias current may result in a diminishing increase in output power. Such a threshold associated with a laser device typically changes over age and operating temperature. For example, FIG. 2 shows a graph illustrating effects of temperature (i.e., different temperatures T1, T2 and T3) on a slope efficiency of a laser device. In the illustrated example, the laser device has a higher slope efficiency at lower operating temperatures.

BRIEF DESCRIPTION OF THE FIGURES

Non-limiting and non-exhaustive embodiments of the present invention will be described with reference to the following figures, wherein like reference numerals refer to like parts throughout the various figures unless otherwise specified.

DETAILED DESCRIPTION

Reference throughout this specification to one embodiment or an embodiment means that a particular feature, structure, or characteristic described in connection with the embodiment is included in at least one embodiment of the present invention. Thus, the appearances of the phrase in one embodiment or an embodiment in various places throughout this specification are not necessarily all referring to the same embodiment. Furthermore, the particular features, structures, or characteristics may be combined in one or more embodiments.

A data bus as referred to herein relates to circuitry for transmitting data between devices. For example, a data bus may transmit data between a host processing system and a peripheral device. However, this is merely an example of a data bus and embodiments of the present invention are not limited in this respect.

An optical transmission medium as referred to herein relates to a transmission medium capable of transmitting light energy in an optical signal which is modulated by a data signal such that the data signal is recoverable by demodulating the optical signal. For example, an optical transmission medium may comprise fiber optic cabling coupled between a transmitting point and a receiving point. However, this is merely an example of an optical transmission medium and embodiments of the present invention are not limited in this respect.

A laser device as referred to herein relates to a device to transmit a light signal in response to a power source. For example, a laser device may transmit a light signal in an optical transmission medium which is modulated by a data signal. A laser device may comprise a laser diode to transmit a light signal in response to a current. However, these are merely examples of a laser device and embodiments of the present invention are not limited in these respects.

A laser driver circuit as referred to herein relates to a circuit to provide power to a laser device to be used for transmitting a light signal in an optical transmission medium. For example, a laser driver circuit may provide a controlled current signal to provide power for transmitting the light signal. However, this is merely an example of a laser driver circuit and embodiments of the present invention are not limited in these respects.

A laser driver circuit may provide a current signal to a laser device having a bias current component combined with a data current component which is modulated by a data signal. The data current signal may be generated by modulating a modulation current with the data signal. The modulation current may determine an extent to which the magnitude of the current signal may deviate from the bias current component. However, these are merely examples of a bias current and modulation current, and embodiments of the present invention are not limited in these respects.

A photodiode as referred to herein relates to a device that provides an output current in response to light energy collected on a surface. For example, a photodiode may provide an output voltage or an output current in response to charge collected at a photodiode gate. However, this is merely an example of a photodiode and embodiments of the present invention are not limited in this respect.

The strength of a light signal from a laser device may be associated with a measurable output power. For example, an output power from a laser device may be measured from a sensor such as a photodiode which is exposed to the light signal. However, this is merely an example of an output power associated with a laser device transmitting a light signal and embodiments of the present invention are not limited in this respect.

An average output power as referred to herein relates to an approximation of the mean output power of a laser device over a time period. For example, an average output power may be determined based upon an integration of an output from a sensor over a period of exposure to a light signal generated by the laser device and subsequent normalization. A swing output power as referred to herein relates to an amount by which an output power of a laser device may deviate from its lowest value to its highest value over a time period. However, these are merely examples of an average output power and swing output power, and embodiments of the present invention are not limited in these respects.

A measured average power signal as referred to herein relates to a signal having a signal strength that is representative of a measurement of an average output power of a laser device. For example, a measured average output power signal may be generated in response to exposure of an actual light sensor to a light signal being generated by a laser device in question. However, this is merely an example of a measured average output power signal and embodiments of the present invention are not limited in these respects.

A reference average power signal as referred to herein relates to a signal having a signal strength that is representative of a desired or target average output power of a laser device. For example, a reference average power signal may comprise a voltage or a current having a magnitude which is representative of the desired or target average output power of a laser device. Such a reference or average power signal may be generated in response to a digital representation of the desired or target average output power. However, these are merely examples of a reference average power signal and embodiments of the present invention are not limited in these respects.

A measured swing power signal as referred to herein relates to a signal having a signal strength that is representative of a measurement of an average output power of a laser device. For example, a measured average output power signal may be generated in response to exposure of an actual light sensor to a light signal being generated by a laser device in question. However, this is merely an example of a measured average output power signal and embodiments of the present invention are not limited in these respects.

A reference swing power signal as referred to herein relates to a signal having a signal strength that is representative of a desired or target swing output power of a laser device. For example, a reference average power signal may comprise a voltage or a current having a magnitude which is representative of the desired or target swing output power of a laser device. Such a reference or average power signal may be generated in response to a digital representation of the desired or target swing output power. However, these are merely examples of a reference swing power signal and embodiments of the present invention are not limited in these respects.

A transimpedance amplifier (TIA) as referred to herein relates to a device to convert an input current to an output voltage. For example, a TIA may convert an input current received from a photodiode to an output voltage that is substantially proportional to a magnitude of the input current. However, this is merely an example of a TIA and embodiments of the present invention are not limited in this respect.

Briefly, an embodiment of the present invention relates to a laser driver circuit to generate a bias current based, at least in part, upon a reference average power signal and a measured average power signal, and to generate a modulation current based, at least in part, upon a reference swing power and a measured swing power signal. However, this is merely an exemplary embodiment and other embodiments are not limited in these respects.

Figure 3:
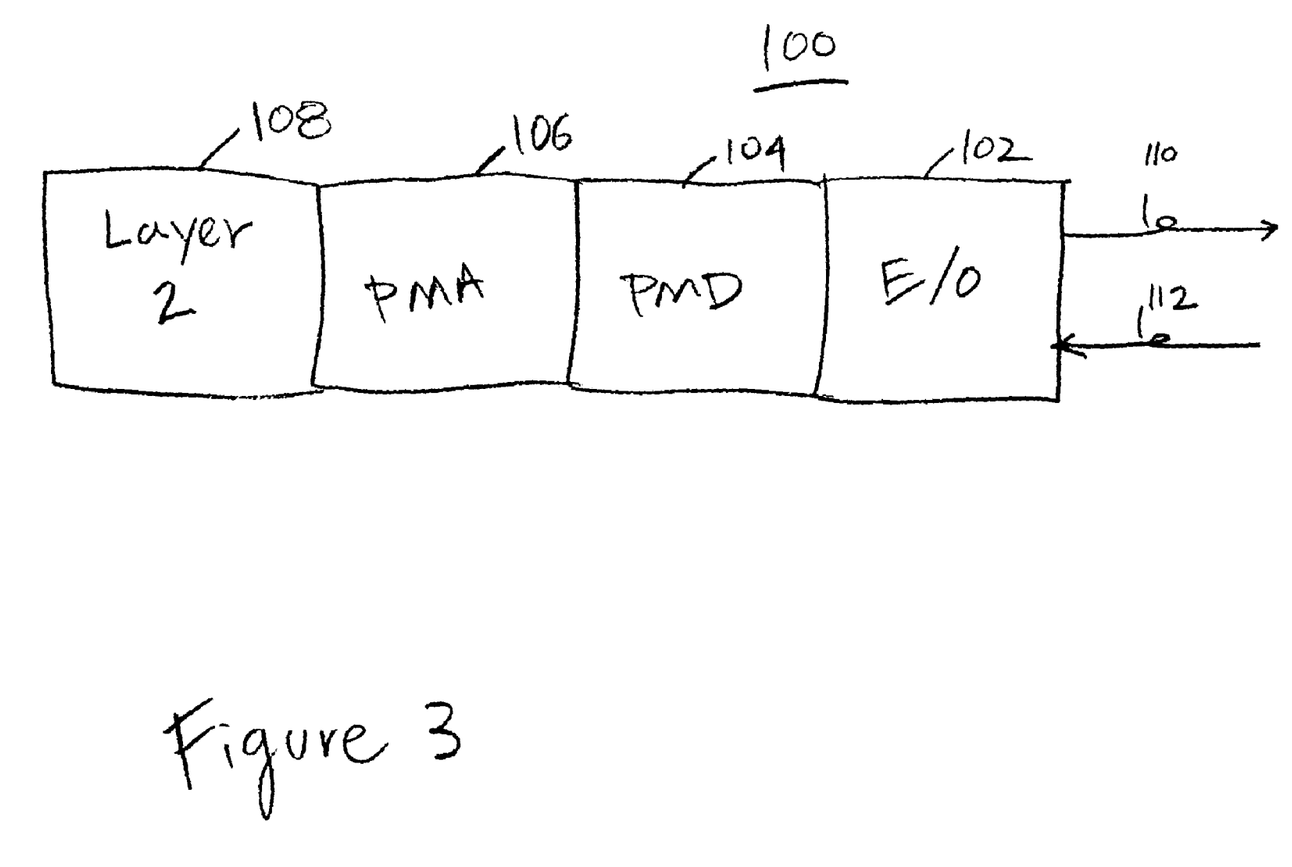
FIG. 3 shows schematic diagram of a system to transmit in and receive data from an optical transmission medium according to an embodiment of the present invention.

FIG. 3 shows a schematic diagram of a system 100 to transmit in and receive data from an optical transmission medium according to an embodiment of the present invention. An optical transceiver 102 may transmit or receive optical signals 110 or 112 in an optical transmission medium such as fiber optic cabling. The optical transceiver 102 may modulate the transmitted signal 110 or demodulate the received signal 112 according to any optical data transmission format such as, for example, wave division multiplexing wavelength division multiplexing (WDM) or multi-amplitude signaling (MAS). For example, a transmitter portion (not shown) of the optical transceiver 102 may employ WDM for transmitting multiple lanes of data in the optical transmission medium.

A physical medium dependent (PMD) section 104 may provide circuitry, such as a transimpedance amplifier (TIA) (not shown) and/or limiting amplifier (LIA) (not shown), to receive and condition an electrical signal from the optical transceiver 102 in response to the received optical signal 112. The PMD section 104 may also provide to a laser device (not shown) in the optical transceiver 102 power from a laser driver circuit (not shown) for transmitting an optical signal. A physical medium attachment (PMA) section 106 may include clock and data recovery circuitry (not shown) and de-multiplexing circuitry (not shown) to recover data from a conditioned signal received from the PMD section 104. The PMA section 106 may also comprise multiplexing circuitry (not shown) for transmitting data to the PMD section 104 in data lanes, and a serializer/deserializer8 (Serdes) for serializing a parallel data signal from a layer 2 section 108 and providing a parallel data signal to the layer 2 section 108 based upon a serial data signal provided by the clock and data recovery circuitry.

According to an embodiment, the layer 2 section 108 may comprise a media access control (MAC) device coupled to the PMA section 106 at a media independent interface (MII) as defined IEEE Std. 802.3ae-2002, clause 46. In other embodiments, the layer 2 section 108 may comprise forward error correction logic and a framer to transmit and receive data according to a version of the Synchronous Optical Network/Synchronous Digital Hierarchy (SONET) protocol as indicated in a set of standards provided by the American National Standards Institute or Synchronous Digital Hierarchy (SDH) as indicated in a set of recommendations provided by the International Telecommunications Union. However, these are merely examples of layer 2 devices that may provide a parallel data signal for transmission on an optical transmission medium, and embodiments of the present invention are not limited in these respects.

The layer 2 section 108 may also be coupled to any of several input/output (I/O) systems (not shown) for communication with other devices in a processing platform. Such an I/O system may include, for example, a multiplexed data bus coupled to a processing system or a multi-port switch fabric. The layer 2 section 108 may also be coupled to a multi-port switch fabric through a packet classifier device. However, these are merely examples of an I/O system which may be coupled to a layer 2 device and embodiments of the present invention are not limited in these respects.

The layer 2 device 108 may also be coupled to the PMA section 106 by a backplane interface (not shown) over a printed circuit board. Such a backplane interface may comprise devices providing a 10 Gigabit Ethernet Attachment Unit Interface (XAUI) as provided in IEEE Std. 802.3ae-2002, clause 47. In other embodiments, such a backplane interface may comprise any one of several versions of the System Packet Interface (SPI) as defined by the Optical Internetworking Forum (OIF). However, these are merely examples of a backplane interface to couple a layer 2 device to a PMA section and embodiments of the present invention are not limited in these respects.

Figure 4:
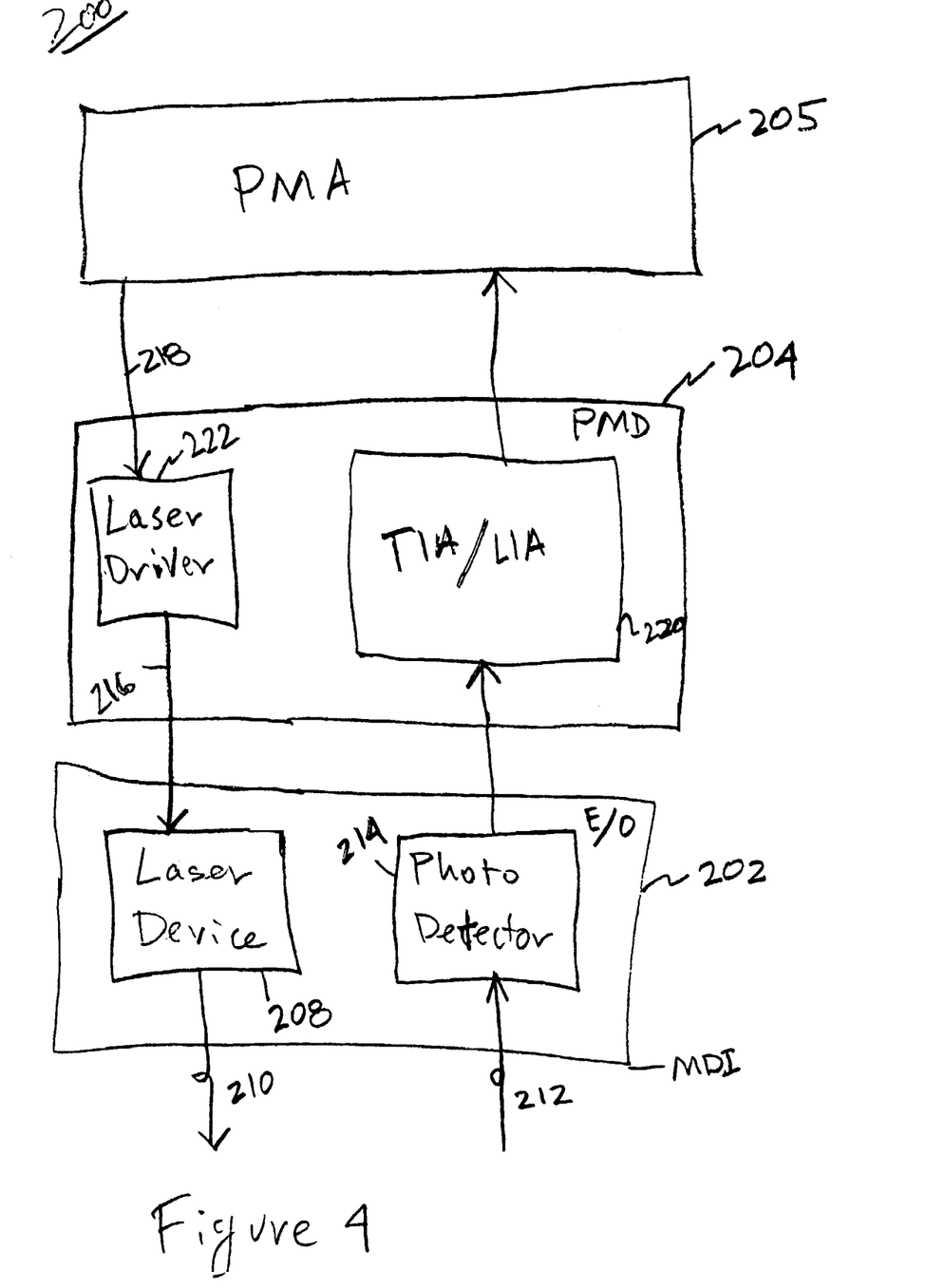
FIG. 4 shows a schematic diagram of physical medium attachment and physical medium dependent sections of a data transmission system according to an embodiment of the system shown in FIG. 3.

FIG. 4 shows a schematic diagram of a system 200 to transmit data in and receive data from an optical transmission medium according to an embodiment of the system shown in FIG. 3. An optical transceiver 202 comprises a laser device 208 to transmit an optical signal 210 in an optical transmission medium and a photo detector section 214 to receive an optical signal 212 from the optical transmission medium. The photo detector section 214 may comprise one or more photodiodes (not shown) for converting the received optical signal 212 to one or more electrical signals to be provided to a TIA/LIA circuit 220. A laser driver circuit 222 may provide a current signal 216 to the laser device 208 in response to a data signal 218 from a PMA section 205. The laser device 208 may then transmit optical signal 210 in response to the current signal 216.

Figure 5:
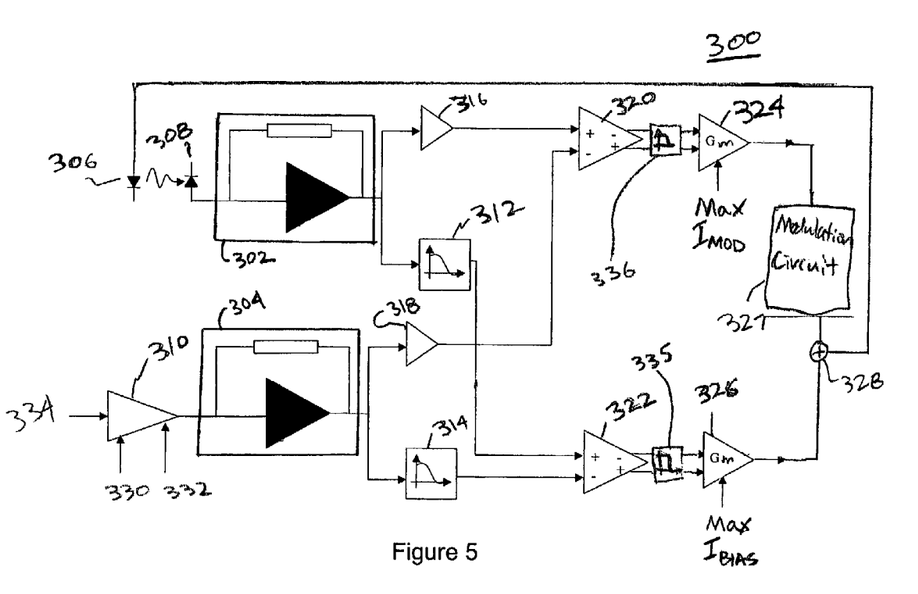
FIG. 5 shows a schematic diagram of a laser driver circuit according to an embodiment of the physical medium dependent section shown in FIG. 4.

FIG. 5 shows a schematic diagram of a laser driver circuit 300 according to an embodiment of the physical medium dependent section 204 shown in FIG. 4. According to an embodiment, a laser diode 306 may transmit a light signal in an optical transmission medium in response to a modulated power signal comprising a bias current generated at an output of an amplifier 326 and a modulated modulation current generated at an output of a modulation circuit 327. The modulation circuit 327 may generate the modulated current based upon a data signal. A circuit 328 may additively combine the outputs of amplifier 326 and modulation circuit 327 to provide the modulated power signal to the laser diode 306 using techniques known to those of ordinary skill in the art of analog circuit design.

In addition to generating the light signal in the optical transmission medium, the laser diode 306 provides the light signal to a monitor photodiode 308. According to an embodiment, the laser driver circuit 300 generates the bias current and the modulation current to have a magnitude based upon the light signal received at the photodiode 308 and inputs received at a mixing circuit 310. The inputs received at the mixing circuit 310 comprise a data signal 334, a reference modulation current 330 and a reference bias current 332.

According to an embodiment, the monitor photodiode 308 may provide a current signal to a TIA 302 in response to receipt of the light signal generated by the laser diode 306. The TIA 302 may convert the current signal to a voltage signal provided to a low pass filter (LPF) 312 and a swing detector circuit 316 where the voltage signal is representative of the strength of the light signal received at the monitor photodiode 308. According to an embodiment, an output of the swing detector 316 may provide a voltage signal as a measured swing power signal which is representative of a measurement of the swing output power of the laser diode 306. However, this is merely an example of how a measured swing power signal may be generated and embodiments of the present invention are not limited in this respect. An output of the LPF 312 may provide a voltage signal as a measured average power signal which is representative of the average output power of the laser diode 306. However, this is merely an example of how a measured average power signal may be generated and embodiments of the present invention are not limited in this respect.

According to an embodiment, the mixing circuit 310 may modulate the reference modulation current 330 with a data signal 334 to provide a modulated modulation current. The mixing circuit 310 may additively combine the modulated modulation current with the reference bias current to provide combined current signal to a TIA 304. The TIA 304 may then convert the combined current signal to a voltage to be received at a swing detector 318 and an LPF 314. According to an embodiment, an output voltage of the swing detector 318 may comprise a reference swing power signal which is representative of a reference swing output power. However, this is merely an example of how a reference swing power signal may be generated and embodiments of the present invention are not limited in this respect. An output voltage of the LPF 314 may comprise a reference average power signal which is representative of a reference average output power. However, this is merely an example of how a reference average power signal may be generated and embodiments of the present invention are not limited in this respect.

According to an embodiment, an operational amplifier 320 may receive the reference swing power signal at an inverting input and the measured swing power signal at a non-inverting input. In addition to providing a gain in the difference between the referenced swing power signal and the measured swing power signal, output terminals of the operational amplifier 320 may also reverse the polarity of the input to the operational amplifier 320. A loop filter 336 may provide a filter the output of the operational amplifier 320 to a transconductance amplifier 324. In response to the filtered output signal, the transconductance amplifier may generate a modulation current. A modulation circuit 327 may generate a modulated signal in response to receipt of the modulation current and a data signal (e.g., from PMA 205). In one embodiment, the modulation circuit may comprise a pair of switch transistors to generate a pulse current in response to the data signal. However, this is merely an example of a modulation circuit that may be used to generate a pulse current signal from a modulation current and data signal, and other modulation circuits known to those of ordinary skill in the art may be used.

According to an embodiment, an operational amplifier 322 may receive the reference average power signal at an inverting input and the measured average power signal at a non-inverting input. In addition to providing a gain in the difference between the referenced average power signal and the measured average power signal, output terminals of the operational amplifier 322 may also reverse the polarity of the input to the operational amplifier 322. A loop filter may filter the output of the operational amplifier 322 and provide the filtered output to a transconductance amplifier 326. In response to the filtered output, the transconductance amplifier 326 may generate a bias current signal.

The operational amplifiers 320 and 322 may be responsive to very small differences in measured and reference values (e.g., difference between measured and reference average power signals at the inputs of operational amplifier 322 and difference between measured and reference swing power signals at the inputs of operational amplifier 320). In a specific example, the difference between measured and reference values may differ by only 1.0 mV. Accordingly, to generate an output 1.0 V (e.g., to obtain a sufficiently high modulation or bias current), an amplifier 320 or 322 may need a gain of about 1000. However, these are merely examples of an operational amplifier gain and differences between measured and average values, and embodiments of the present invention are not limited in these respects.

The loop filters 335 and 336 following operational amplifiers 322 and 320, respectively, may comprise low pass filters having a sufficiently low bandwidth frequency response to provide stability to the average power control loop (i.e., to generate the bias current) and the modulation swing power control loop (i.e., to generate the modulation current). Each of the loop filters 335 and 336 may be constructed as a resistor and capacitor couple in series (not shown). However, this is merely an example of a circuit topology for a low pass filter and other circuit topologies known to those of ordinary skill in the art may be used. Also, the loop filters 335 and 336 may be constructed to have frequency responses different from one another (e.g., frequency responses of different bandwidths). This may enable the average power control loop and modulation swing power control loop to settle independently of one another.

According to an embodiment, the two TIAs 302 and 304 may be formed to have substantially the same behavior in response to an input current (e.g., from the photodiode 308 or the mixing circuit 310) and in response to any changes in temperature or power supply. For example, the TIAs 302 and 304 may comprise an identical circuit topology and formed according to an identical or uniform semiconductor processing technique. By matching the behavior of the TIAs 302 and 304, the voltage signal applied to the input terminals of the operational amplifier 320 may accurately represent a difference between the measured swing power (from the output of TIA 302) and reference swing power (from the output of TIA 304). Matching the behavior of the TIAs 302 and 304 may also accurately represent to the input terminals of operational amplifier 322 a difference between a measured average power (from the output of the TIA 302) and a reference average power (from the output of the TIA 304). Thus, changes in temperature or power supply may not affect the accuracy of the control loops used to drive the modulation current output of transconductance amplifier 324 so that the measured output swing power approaches the reference output swing power, and to drive the bias current output of transconductance amplifier 326 so that the measured average output power approaches the reference average output power.

According to an embodiment, the reference modulation current 330 may be generated according to a desired or target swing output power of the laser diode 306 and the reference bias current 332 may be generated to according to a desired or target average output power of the laser diode 306. For example, either the reference modulation current or the reference bias current 332 may be generated by coupling a resistor to a controlled voltage source where the resistance of the resistor is selected to provide a desired current magnitude.

Figure 6:
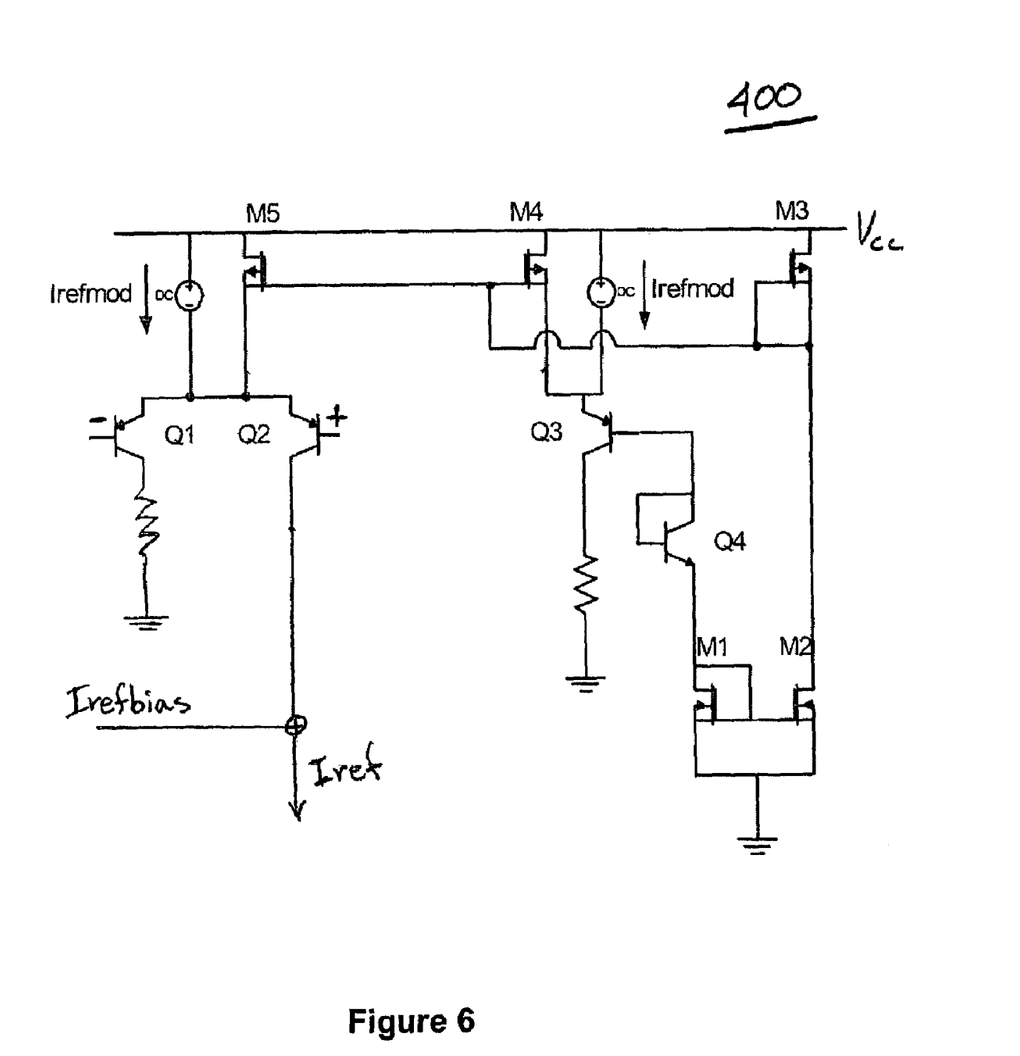
FIG. 6 shows a schematic diagram of a mixing circuit according to an embodiment of the laser driver circuit shown in FIG. 5.

FIG. 6 shows a schematic diagram of a mixing circuit 400 according to an embodiment of the mixing circuit 310 shown in FIG. 5. According to an embodiment, the mixing circuit 400 may be formed using a BiCMOS process to enable the formation of bipolar and field effect transistors on the same semiconductor device. A data signal (e.g., data signal 334 as shown in FIG. 5) may be received at base terminals of transistors Q1 and Q2 such that the transistor Q2 is turned on to generate a current for a 1 and Q1 is turned on to transmit a current to ground for a 0. The current generated by transistor Q2 may be additively combined with a reference bias current Irefbias (e.g., reference bias current 332 shown in FIG. 5) to generate a reference current Iref (e.g., to TIA 304 shown in FIG. 5).

A reference modulation current Irefmod (e.g., reference modulation current 330) may be applied to the emitter terminals of transistors Q1, Q2 and Q3. According to an embodiment, the output current of Q2 (in response to a data signal of 1) to be combined with reference bias current Irefbias has a magnitude that is substantially equal to the magnitude of the reference modulation current Irefmod. Accordingly, a transistor M5 may generate a current that is substantially equal to a base current loss from the base terminal of transistor Q2.

According to an embodiment, the transistors Q1, Q2 and Q3 may be formed substantially identically and behave substantially the same in response to process, temperature and power supply variations. Transistors M3, M4 and M5 are mirror coupled such that they generate the same current in response to a gate voltage. Since the emitter terminal of Q3 receives the reference modulation current Irefmod and a current from transistor M4 (i.e., substantially a replica of the current generated by the transistor M5), the current at the base terminal of transistor Q3 is substantially equal to the current at the base terminal of transistor Q2. This current at the base terminal of transistor Q3 is then measured and mirrored by transistors M1, M2 and M3 to feedback the base current loss to mirror coupled transistors M4 and M5. Accordingly, the M5 current provides the base loss current back to the emitter terminal of transistor Q2.

Figure 7:
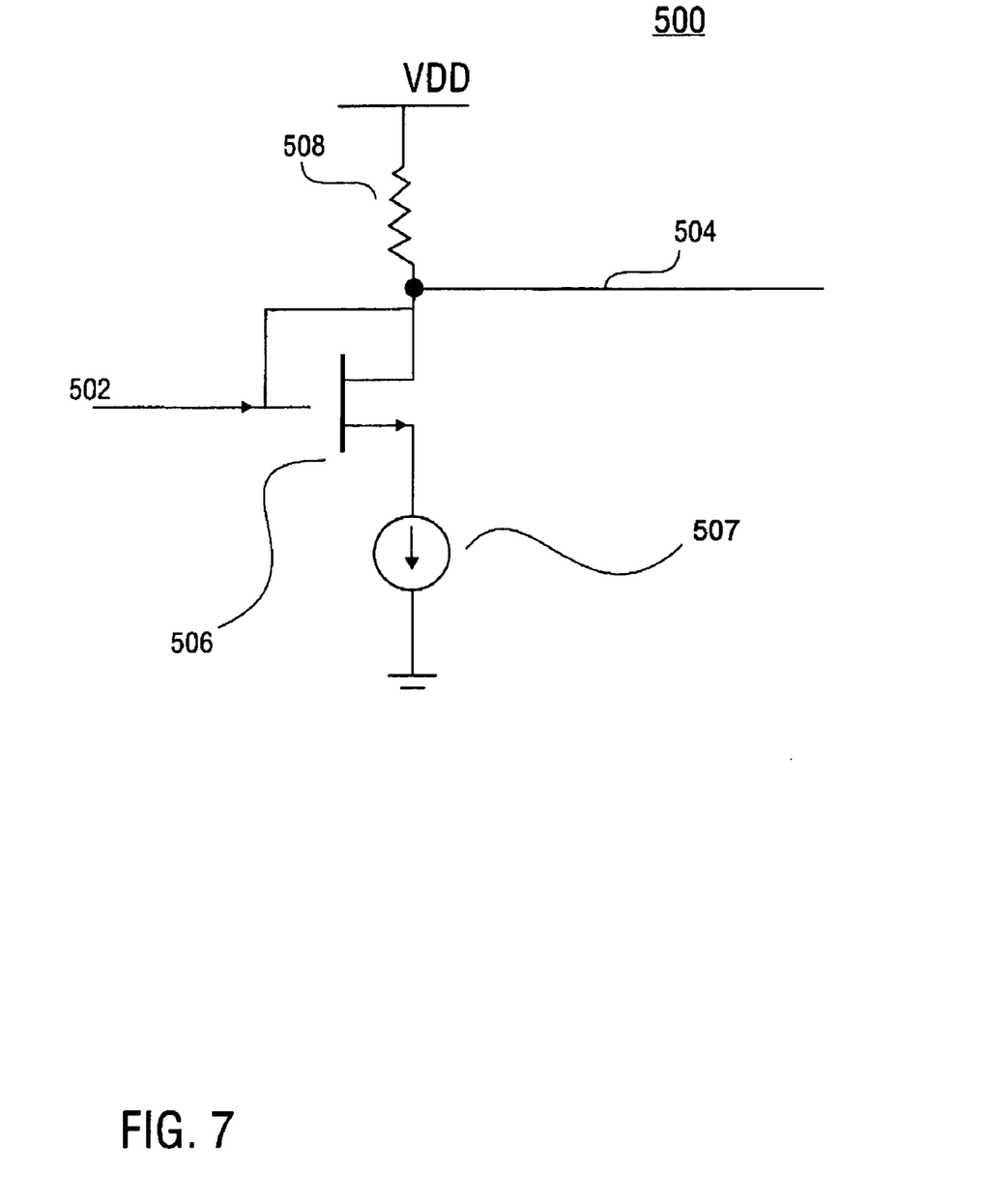
FIG. 7 shows a schematic diagram of a transimpedance amplifier according to an embodiment of the laser driver circuit shown in FIG. 5.

FIG. 7 shows a TJA 500 according to an embodiments of the TIAs 302 and 304 shown in FIG. 5. A metal oxide semiconductor (MOS) transistor 506 may be biased with a tail current 507 and drive a resistor 508 coupled to a voltage source. A gate terminal 502 may receive an input current (e.g., from a photodiode) causing a shift in output voltage at output terminal 504 that is about proportional to the input current. However, this is merely an example topology of a TIA and embodiments of the present invention are not limited in this respect.

While there has been illustrated and described what are presently considered to be example embodiments of the present invention, it will be understood by those skilled in the art that various other modifications may be made, and equivalents may be substituted, without departing from the true scope of the invention. Additionally, many modifications may be made to adapt a particular situation to the teachings of the present invention without departing from the central inventive concept described herein. Therefore, it is intended that the present invention not be limited to the particular embodiments disclosed, but that the invention include all embodiments falling within the scope of the appended claims.

What is claimed is:

1. A system comprising:
a serializer to provide a serial data signal in response to a parallel data signal;
a laser device adapted to be coupled to an optical transmission medium to transmit an optical signal in the optical transmission medium; and
a laser driver circuit to provide a modulated power signal to the laser device in response to the serial data signal, the laser driver circuit comprising:
a circuit to generate a bias current based, at least in part, upon a reference average power signal and a measured average power signal representative of a measured average power transmitted by a laser device;
a circuit to generate a modulation current based, at least in part, upon a reference swing power signal and a measured swing power signal representative of a measured swing power transmitted by the laser device; and
a circuit to generate the modulated power signal based, at lease in part, on the bias current and modulation current.

2. The system of claim 1, the system further comprising a SONET framer to provide the parallel data signal.

3. The system of claim 2, wherein the system further comprises a switch fabric coupled to the SONET framer.

4. The system of claim 1, the system further comprising an Ethernet MAC to provide the parallel data signal at a media independent interface.

5. The system of claim 4, wherein the system further comprises a multiplexed data bus coupled to the Ethernet MAC.

6. The system of claim 4, wherein the system further comprises a switch fabric coupled to the Ethernet MAC.

7. A method comprising:
generating a bias current based, at least in part, upon a reference average power signal and a measured average power signal representative of a measured average power transmitted by a laser device;
generating a modulation current based, at least in part, upon a reference swing power signal and a measured swing power signal representative of a measured swing power transmitted by the laser device; and
providing a modulated power signal to the laser device based, at least in part, on the bias current and modulation current.

8. The method of claim 7, wherein the measured average power signal comprises at least one of a current and a voltage representative of a magnitude of the measured average power transmitted by the laser device.

9. The method of claim 7, wherein the measured swing power signal comprises at least one of a current and a voltage representative of a magnitude of the measured swing power transmitted by the laser device.

10. The method of claim 7, the method further comprising:
generating the reference average power signal based, at least in part, upon an output voltage signal of a first transimpedance amplifier; and
generating the measured average power signal based, at least in part, upon an output voltage signal of a second transimpedance amplifier.

11. The method of claim 10, wherein the first and second transimpedance amplifiers each provide an output voltage in response to an input current at substantially the same gain.

12. The method of claim 10, wherein the laser driver circuit further comprises:
generating the reference average power signal at an output of a first low pass filter in response to the output voltage signal of the first transimpedance amplifier; and
generating the measured average power signal at an output of a second low pass filter in response to the output voltage signal of the second transimpedance amplifier.

13. The method of claim 7, the method further comprising:
generating the reference average power signal based, at least in part, on an output voltage signal of a first transimpedance amplifier; and
generating the measured average power signal based, at least in part, on an output voltage signal of a second transimpedance amplifier.

14. The method of claim 13, wherein the first and second transimpedance amplifiers each provide an output voltage in response to an input current at substantially the same gain.

15. The method of claim 13, the method further comprising:
generating the reference swing power signal at an output of a first swing detector circuit in response to the output voltage signal of the first transimpedance amplifier, and
generating the measured swing power signal at an output of a second swing detector circuit in response to the output voltage signal of the second transimpedance amplifier.

16. The method of claim 7, the method further comprising:
modulating the modulation current with data signal to provide a pulse current signal; and
combining the pulse current signal with the bias current to provide the modulated power signal.

17. A laser driver circuit comprising:
a circuit to generate a bias current based, at least in part, upon a reference average power signal and a measured average power signal representative of a measured average power transmitted by a laser device;
a circuit to generate a modulation current based, at least in part, upon a reference swing power signal and a measured swing power signal representative of a measured swing power transmitted by the laser device; and
a circuit to provide a modulated power signal to the laser device based, at least in part, on the bias current and modulation current.

18. The laser driver circuit of claim 17, wherein the measured average power signal comprises at least one of a current and a voltage representative of a magnitude of the measured average power transmitted by the laser device.

19. The laser driver circuit of claim 17, wherein the measured swing power signal comprises at least one of a current and a voltage representative of a magnitude of the measured swing power transmitted by the laser device.

20. The laser driver circuit of claim 17, the laser driver circuit further comprising:
a first transimpedance amplifier to generate the reference average power signal; and
a second transimpedance amplifier to generate the measured average power signal.

21. The laser driver circuit of claim 20, wherein the first and second transimpedance amplifiers each provide an output voltage in response to an input current at substantially the same gain.

22. The laser driver circuit of claim 20, wherein the laser driver circuit further comprises:
   a first low pass filter to generate the reference average power signal in response to a voltage signal from the first transimpedance amplifier; and
   a second low pass filter to generate the measured average power signal in response to a voltage signal from the second transimpedance amplifier.

23. The laser driver circuit of claim 20, wherein the laser driver circuit further comprises:
   a first swing detector circuit to generate the reference swing power signal in response to a voltage signal from the first transimpedance amplifier; and
   a second swing detector circuit to generate the measured swing power signal in response to a voltage signal from the second transimpedance amplifier.

24. The laser driver circuit of claim 17, the laser driver circuit further comprising:
   a modulation circuit to modulate the modulation current with data signal to provide a pulse current signal; and
   a circuit to combine the pulse current signal with the bias current to provide the modulated power signal.

* * * * *

UNITED STATES PATENT AND TRADEMARK OFFICE
CERTIFICATE OF CORRECTION

PATENT NO. : 7,142,574 B2  Page 1 of 1
APPLICATION NO. : 10/442829
DATED : November 28, 2006
INVENTOR(S) : Asuri et al.

It is certified that error appears in the above-identified patent and that said Letters Patent is hereby corrected as shown below:

On the face page, in field (56), under "U.S. Patent Documents", in column 2, line 7, after "6,654,565" delete "B1" and insert -- B2 --, therefor.

On the face page, in field (56), under "U.S. Patent Documents", in column 2, line 8, after "6,744,795" delete "B1" and insert -- B2 --, therefor.

On the face page, in field (56), under "U.S. Patent Documents", in column 2, line 9, after "6,822,987" delete "B1" and insert -- B2 --, therefor.

In column 9, line 25, in Claim 1, after "at" delete "lease" and insert -- least --, therefor.

In column 10, line 29, in Claim 15, after "transimpedance" delete "amplifier," and insert -- amplifier; --, therefor.

Signed and Sealed this

Twenty-fourth Day of June, 2008

JON W. DUDAS
*Director of the United States Patent and Trademark Office*